United States Patent [19]

Lukens

[11] Patent Number: 4,551,687
[45] Date of Patent: Nov. 5, 1985

[54] AMPLIFIER FOR MEASURING LOW-LEVEL SIGNALS IN THE PRESENCE OF HIGH COMMON MODE VOLTAGE

[75] Inventor: Fred E. Lukens, Littleton, Colo.

[73] Assignee: The United States of America as represented by the Administrator of the National Aeronautics and Space Administration, Washington, D.C.

[21] Appl. No.: 638,584

[22] Filed: Aug. 7, 1984

[51] Int. Cl.[4] .............................................. H03F 3/68
[52] U.S. Cl. .................................. 330/258; 330/311; 330/261
[58] Field of Search ............... 330/258, 259, 260, 261, 330/310, 311

[56] References Cited

U.S. PATENT DOCUMENTS 4,232,271 11/1980 Dobkin et al. ...................... 330/258

Primary Examiner—Eugene R. LaRoche
Assistant Examiner—Steven J. Mottola
Attorney, Agent, or Firm—Joseph H. Beumer; John R. Manning; Leon D. Wofford, Jr.

[57] ABSTRACT

A high common mode rejection differential amplifier wherein two serially arranged Darlington amplifier stages (28, 44) are employed and any common mode voltage is divided between them by a resistance network (53). The input to the first Darlington amplifier stage (28) is coupled to a signal input resistor (8) via an amplifier (16) which isolates the input and presents a high impedance across this resistor. The output of the second Darlington stage (44) is transposed in scale via an amplifier stage (66) which has in its input a biasing circuit which effects a finite biasing of the two Darlington amplifier stages (28, 44).

15 Claims, 1 Drawing Figure

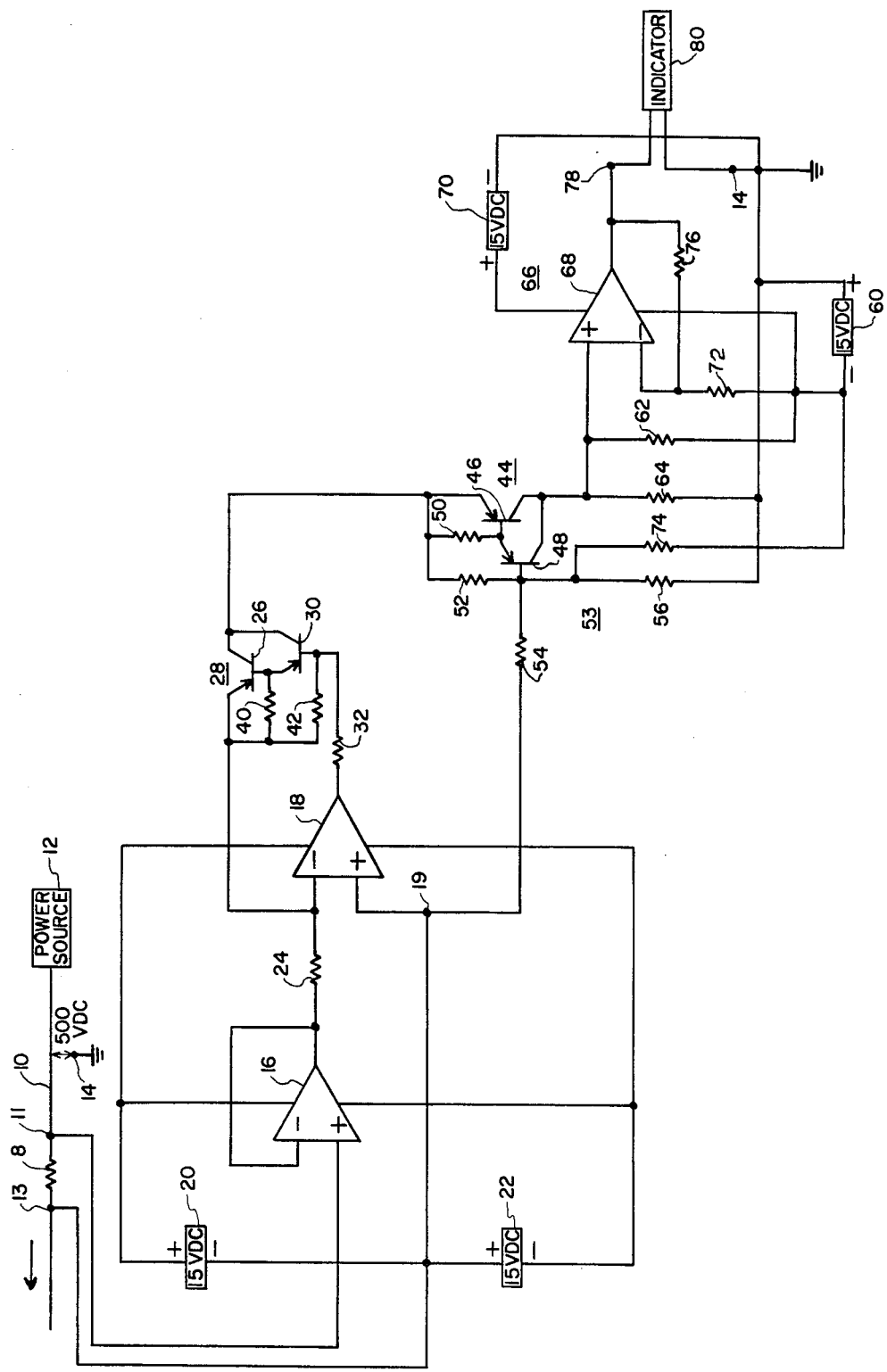

AMPLIFIER FOR MEASURING LOW-LEVEL SIGNALS IN THE PRESENCE OF HIGH COMMON MODE VOLTAGE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

TECHNICAL FIELD

This invention relates to amplifiers for the measurement of low level signals wherein there may be widely ranging common mode voltages including high frequency noise.

BACKGROUND ART

There are many instances wherein it is necessary to accurately deal with small voltages which are encumbered by high frequency noise and the presence of high, and conceivably, variable, other common mode voltages. An illustration of this would be in the monitoring of current through a high voltage conductor of a high voltage direct current power line, such as that emanating from a large scale photoelectric solar array. Typically, in such case, current would be sensed by a small value resistor in the power line, with the voltage across this resistor being indicative of current. Assume, for example, that the actual supply voltage on a power line is on the order of 500 volts and that small voltages, representative of current through the power line, are sampled and that it is desired to amplify these small voltages and provide an output signal representative of them which is referenced to a ground or other reference with respect to which the 500 volts on the line appears. This obviously requires measurement circuitry which must be responsive to small voltages but be able to withstand the presence of a higher one. This suggests the employment of some form of isolation between elements of the measurement system and the high voltage environment. In accordance with this approach, one technique has been to employ Hall effect devices. A second approach is to isolate the sense signal from the analog output signal with a converter using a transformer. A third approach is to use an analog-to-digital converter with optical isolators between the sensed signal and the output. The Hall effect device and the transformer passing on analog signal and the optical isolators passing digital signals will withstand the high and low common mode voltages acceptably. None of these approaches have proven optimum in terms of cost, accuracy, part count, and effective range of operation.

It is the object of this invention to provide an alternate approach and one which employs only simple and inexpensive electronic components, namely, only resistors, standard operational amplifiers, and low cost transistors. In addition to the lower cost that necessarily results, it is the further object of this invention to enable extremely accurate measurements over quite acceptable ranges of measurement.

DISCLOSURE OF INVENTION

In accordance with the present invention, the voltage to be amplified is assumed to appear across electrical resistance in an electrical conductor and wherein the electrical conductor itself is at some fairly high potential with respect to a common conductor or ground. In accordance with the applicant's system, two Darlington amplifier stages are connected in series. The common mode voltage is equally distributed between them by a voltage divider across the inputs of the stages. By this approach, reliable but inexpensive transistors can be employed in the Darlington stages. A minimum operating bias is applied to the two Darlington stages by application of a bias to the collectors of the second Darlington stage. The output of the second Darlington stage is voltage amplified to a desired voltage level for a meter or other indicating or processing circuitry.

BRIEF DESCRIPTION OF DRAWING

The single drawing in this case is an electrical schematic diagram of an embodiment of the invention.

DETAILED DESCRIPTION OF THE PREFERRED EMBODIMENT

Referring to the drawing, a small value (that may be calculated by 0.20 volts/Imax; 0.20 volts is a typical maximum input voltage that is applied to the amplifier, and Imax is the maximum expected current conducted through the small value resistor) resistor 8 is placed in, by way of example, a power line 10 carrying direct current power from a power source 12 and which serves as a current measurement sensor. Further, by way of example, the power source would provide a voltage on power line 10 of +500 volts with respect to ground terminal 14. There will appear a voltage across resistor 8 which is, of course, a direct function of the current flow, and, in the present illustration, this voltage may vary over a range of from 0 to 0.2 volts (for maximum current condition). It is contemplated that this range must be amplified and translated in order to compatibly supply indicating circuitry, typically, for example, operating in a range of 0 to 5 volts with respect to ground terminal 14. It is to be appreciated that one cannot simply and inexpensively amplify the 0-0.2 voltage range from resistor 8 by virtue of the fact that it is impressed upon a basic or common mode voltage of 500 volts. Standard and low cost current amplifying devices, such as operational amplifiers and transistors, are not capable of handling input voltages in excess of 40 volts. It is a feature of the amplifier to add two series connected Darlington stages to the standard operational amplifiers that will have all of the common mode voltage applied, reducing to less than a volt the common mode voltage applied to the input of any operational amplifier. By using operational amplifiers that are required to support less than a volt common mode and transistors in the Darlington configured output stage that have no more than 250 volts applied, the employment of low cost transistors and amplifying elements can be used.

Examining the circuitry, it is to be appreciated that with current flow in the indicated direction through power line 10 and thus resistor 8, the voltage at terminal 11, with respect to terminal 13, will move positive in potential with an increase in current flow; and, as indicated by way of example above, the relationship between the value of resistor 8 and the maximum current flow will be such that the range of voltage appearing across a resistor 8 having a value of 0.020 ohms, will be from 0 (at 0 current flow) to 0.2 volts (with maximum current flow). The positive going voltage at terminal 11, with respect to terminal 13, is connected to the non-inverting input of operational amplifier 16. Operational amplifier 16 is conventionally biased by ± power supplies 20 and 22 which are referenced to input terminal 14 and float above ground terminal 14. The inverting input of operational amplifier 16 is directly connected to its output whereby operational amplifier 16 has unity voltage gain. Its function is to provide a high impedance input whereby, effectively, no loading impedance is presented across resistor 8, which could otherwise lead to inaccuracies in measurement. The output of operational amplifier 16 is fed through output resistor 24 having, in the example, the value of 200 ohms, the current through the resistor being in a range of from 0.000 to 0.001 amperes. There thus appears across resistor 24 a voltage of from 0 to 0.2 volts corresponding to the voltage appearing across resistor 8.

The current flow through resistor 24 is fed to the emitter input of PNP transistor 26 of Darlington amplifier 28. The base drive current of transistor 26 is fed to the emitter of transistor 30. The transistor 30 base drive current is fed to the output of amplifier 18 through resistor 32. The inverting input of operational amplifier 18 is connected to resistor 24 and to the emitter of transistor 26 of Darlington amplifier 28, and the non-inverting input is connected to terminal 13 of resistor 8. The inverting and non-inverting inputs of amplifier 18 are within 5 millivolts of being equal since amplifier 18 has a high level of voltage feedback from its output to the inverting input. The voltage across resistor 24 is then equal to the voltage across resistor 8 plus the offset voltages of amplifiers 16 and 18. The sum of offset voltages is typically less than 1 millivolt.

Operational amplifier 18 is powered, like operational amplifier 16, from power supplies 20 and 22, and it, too, thus floats above ground. By virtue of the circuit arrangement, Darlington amplifier 28 is ultimately driven, differentially, responsive to the voltage first appearing across resistor 8.

Significantly, essentially all of the current flow through resistor 24, replicating flow through resistor 8, flows through the emitter collector circuit of Darlington amplifier 28, and only a negligible amount flows through the base, this being a characteristic of a Darlington transistor amplifier. In this fashion extreme accuracy is preserved. Resistors 40 and 42 are conventional and are for the purpose of enabling a small bypass current flow in the event that the collector leakage of one of the transistors should become larger than the base drive required.

Darlington amplifier 44 is like amplifier 28, employing PNP transistors 46 and 48 and base-emitter resistors 50 and 52. It is driven by the collector current output of Darlington amplifier 44, and as in the case of amplifier 28, essentially all of the current flows through the emitter-collector circuits of transistors 46 and 48. A reference potential which follows the common mode potential on input terminal 13 is effected on the base of transistor 48 of Darlington amplifier 44 by a mid point connection to a voltage divider 53 consisting of equal value resistors 54 and 56 (each 100,000 ohms) connected between terminal 13 and ground. This circuit equally divides the 500 volt common mode voltage effectively present between the inputs of Darlington amplifiers 28 and 44. Since the emitter-collector output circuits of these amplifiers are alike, there is an equal division of the common mode voltage across the output circuits of the two amplifiers as determined by the input voltage division. This follows since emitter-base voltages are less than 1 volt. The common mode voltage in the example is indicated to be 500 volts, 250 volts across each of the two Darlington transistor amplifier stages. This enables the employment of relatively low cost, high reliability, 300 volt rated, transistors, two of which cost substantially less than a single high reliability transistor having a rating sufficiently high to accommodate 500 volts.

While the description thus far has been in terms of a sensing or measurement system wherein the common mode voltage was 500 volts, this is by no means to be considered a limitation. Where it is desired to sense or make measurements in a higher voltage environment, the number of Darlington stages can simply be increased accordingly with appropriate input voltage division, distributing input voltages evenly between the stages.

A further significance of applicant's circuitry is that it is employable with widely varying common mode voltages ranging down to zero volts. To accomplish this, 15 volt negative bias supply 70 provides a collector bias through resistor 62, 4,000 ohms, and across resistor 64, 5,000 ohms, between the collectors of Darlington amplifier 44 and ground. Thus, in the event that the common mode voltage should fall to zero, there still would be an operating bias on each of the Darlington stages. In the circuit shown, and with no input signal and no signal current flow through the emitter-collector circuits of Darlington stages 28 and 44, there would be a collector bias present at the collector of Darlington stage 44 of a minimum of $-8.3$ volts, and thus as emitter-collector bias across the two Darlington amplifier stages 28 and 44. With a swing of from zero current to these stages up to 0.001 amperes, the applied collector voltage across the two stages would increase to $-6.1$ volts. However, this is still sufficient to enable linear operation of each of the Darlington amplifier stages which would share between them this 6.1 volts. The 0–0.001 amperes collector output of the second Darlington stage 44 appears across resistor 64 and, as suggested above, presents a voltage swing for this current range of from $-8.3$ to $-6.1$ volts.

This voltage excursion is converted to a more convenient range of from 0 to 5 volts by amplifier stage 66, which employs operational amplifier 68. Operational amplifier 68 is conventionally biased by $-15$ volt power supply 60 and $+15$ volt power supply 70. A voltage divider circuit consisting of resistor 72, 4,000 ohms, and resistor 76, 5,000 ohms, is connected, with the resistors appearing in the listed order, between the negative terminal of power supply 60 and the output of operational amplifier 68, with the mid point between these resistors being connected to the inverting input of operational amplifier 68. This combination sets the voltage gain from the non-inverting input of amplifier 68 to its output to R76/R74, which, in the example, is 2.273 volts. The voltage to be amplified, appearing across resistor 64, is applied to the non-inverting input of operational amplifier 68. The voltage divider 53 is connected to power supply 60 through resistor 74. With a zero current signal from Darlington amplifier 28 and Darlington amplifier 44, there will be a $-8.3$ volts applied to the non-inverting input terminal of amplifier 68 and a zero voltage output from terminal 78 to ground. With a maximum input signal from Darlington 44, which is 0.001 amperes, the voltage on the non-inverting input of operational amplifier 68 will be $-6.1$ volts. The voltage from terminal 78 to terminal 14 will be 5.0 volts. The effective transimpedance gain which is the terminal 78 voltage change divided by the change in the Darlington 44 current is 5,000 ohms for the example and is in general equal to the value of resistor 76. Intermediate input current levels from Darlington 44 signals will, or course, proportionally produce voltages between 0 and 5 volts. Although the foregoing description is technically correct, additional clarification is required to assure the salient features are understood. Ignoring the input current from Darlington 44, amplifier 66 is a simple differential amplifier. The input is −15 VDC fed through input resistors 72 and 62. The voltage applied to both the inverting and non-inverting inputs is −8.3 volts. Since the voltages to both inputs to the differential amplifier are equal, the amplifier 66 output voltage is zero. Note that, by design, the ratio between resistors 76 and 72 is equal to the ratio between resistors 64 and 62. Basic circuit analysis predicts that if these ratios are equal, the amplifier 68 output voltage is zero. The Darlington amplifier 44 output, when greater than zero, will cause the output to increase by a transimpedance gain equal to R76. This gain can also be derived by standard circuit analysis techniques. In the example, R76 is 5,000 ohms, which causes the terminal 78 voltage to be 5.0 volts when Darlington amplifier 44 output is 0.0010 amperes and causes the terminal 78 voltage to be zero when the Darlington amplifier 44 output is zero amperes. This is the desired amplifier 68 operation. The output of amplifier stage 66 is applied to a conventional current indicator 80 with a 0–5 volt meter movement or applied to other measurement or control circuitry adapted to respond to the 0–5 volt range.

From the foregoing, it is to be appreciated that there has been provided an improved amplifier for employment in the detection and/or measurement of electrical variations occurring in an electrical line or circuitry which operate at voltages substantially higher than a basic reference point. The detection or measurement is made of the quantity in question independent of the actual potential, or common mode voltage, above the reference of the line or other circuitry and independent of common mode noise on the line or circuitry. Further, the amplifier is constructed with common and relatively cheap components and yet achieves an overall accuracy on the order of 1%.

With minor modifications the present invention may also be applied where the high voltage from power source 12 is negative rather than positive. The circuit would be modified to use NPN rather than PNP type transistors for transistors 26, 30, 46 and 48. The voltage from voltage supply 70 would be changed from +15 volts to −15 volts, and conversely the voltage from voltage supply 60 would be changed from negative to positive. With this configuration the output voltage at indicator 80 will be between 0 and −5 volts. Alternatively, a positive output voltage from 0 to +5 volts could be obtained by appropriate adjustment of resistor values.

Although the invention has been described in relation to exemplary embodiments thereof, it will be understood by those skilled in the art that variations and modifications can be effected in these exemplary embodiments without departing from the scope of spirit of the invention.

I claim:

1. An amplifier circuit for the amplification of low level signals present in a circuit independent of high common mode voltage and high noise on that circuit with respect to a separated electrical reference, comprising:

a power source;

a first resistor for current measurement sensing serially connected to said power source;

a couple of input leads, with one on each side of said resistor;

a voltage follower circuit comprising a first operational amplifier with an inverting input terminal, a noninverting input terminal, an output terminal and two terminals for voltage biasing, said inverting input terminal connected directly to said output terminal, said noninverting input terminal serially connected to said input lead between said power source and said first resistor, said voltage follower for acting as a buffer for preventing undesired interactions between the amplifier circuit and said power source;

a second operational amplifier with an inverting input terminal, a noninverting input terminal, an output terminal and two biasing terminals for voltage biasing, said noninverting input terminal serially connected to said lead on the side of said first resistor furthest from said power source, said inverting input terminal serially connected through said second resistor to said first operational amplifier;

a second resistor between said output terminal of said operational amplifier and said inverting input terminal of second operational amplifier;

a first Darlington amplifier comprising first and second PNP transistors, each of said transistors having a collector, base, and emitter, said collectors of said transistors being serially connected, said emitter of said first transistor being connected to said inverting input terminal of said second operational amplifier, said base of said first transistor serially connected to said emitter of said second transistor, said base of said second transistor serially connected to said output terminal of said second operational amplifier;

a third resistor between said emitter of said first transistor and said base of said first transistor;

a fourth resistor between said emitter of said second transistor and said base of said second transistor;

a second Darlington amplifier comprising a first PNP transistor and a second PNP transistor, each of said PNP transistors having a collector, a base and an emitter, said collectors of said transistors being serially connected, said emitter of said first transistor being serially connected to said collectors of said first Darlington amplifier, said base of said first transistor serially connected to said emitter of said second transistor, said base of said second transistor serially connected to said noninverting input terminal of said second operational amplifier;

a fifth resistor between said noninverting input of said second operational amplifier and said base of said second transistor of said second Darlington amplifier;

a sixth resistor between said emitter of said first transistor of said second Darlington amplifier and said base of said first transistor of said second Darlington amplifier;

a seventh resistor between said emitter of said second transistor of said second Darlington amplifier and said base of said second transistor of said second Darlington amplifier;

a voltage biasing means connecting said biasing terminals of said first and said second operational amplifiers in parallel;

a third operational amplifier with an inverting input terminal, a noninverting input terminal, an output terminal, two biasing terminals for voltage biasing; said noninverting input terminal serially connected to said collectors of said second Darlington amplifier, said inverting input terminal connected to ground;

an eighth resistor connected between said inverting input terminal of said third operational amplifier and said output terminal of said third operational amplifier;

a second biasing means coupled to said third operational amplifier for voltage biasing said third operational amplifier;

a ninth resistor connected between said inverting input terminal of said third operational amplifier and said second biasing means;

a tenth resistor connected between said base terminal of said second transistor of said second Darlington amplifier and ground;

an eleventh resistor connected between said base terminal of said second transistor of said second Darlington amplifier and said biasing means;

a twelfth resistor coupled between said collectors of said second Darlington amplifier and ground;

a thirteenth resistor connected between said collectors of said second Darlington amplifier and said second biasing means;

a fourteenth resistor biasing connector between said collectors of said second Darlington amplifier and said second biasing means, said fourteenth resistor connected in parallel to said thirteenth resistor; and an output terminal coupled to said third operational amplifier through said second biasing means.

2. An amplifier for the amplification of signals present in a circuit independent of common mode voltages on that circuit with respect to a separated electrical reference, comprising:

an electricl sensor coupled to said circuit and comprising first and second input terminals and means for providing an electrical output voltage across said first and second input terminals;

first and second Darlington transistor amplifier stages having inputs and outputs, the output of one said Darlington stage being serially connected to the input of the other said Darlington stage;

input circuit means for coupling the said output signal of said first and second input terminals differentially to inputs of said Darlington amplifier stages and including a voltage divider coupled between said circuit and said electrical reference and coupled across the input of said amplifier stages and coupled to divide the voltage between said circuit and said electrical reference, wherein an input to one of said amplifier stages is at a circuit potential and where an input to the other said amplifier stage is at a potential equal to a fraction of potential difference between said circuit and said electrical reference, which fraction is equal to the reciprocal of the number of said amplifier stages, said input circuit means further including an isolation amplifier, having a first, non-inverting input, a second, inverting input and an output and having a high input impedance and low output impedance, coupled between said first input terminal and an emitter input to said first Darlington transistor amplifier stage, an operational amplifier having its inverting input coupled to the output of said isolation amplifier, its non-inverting input coupled to said second input terminal, and its output coupled to an input base of said first Darlington transistor amplifier stage, said second input terminal being coupled through said voltage divider to the base input of said second Darlington transistor amplifier stage; and output circuit means for providing an amplified signal with respect to said electrical reference proportional to said output signal from said electrical sensor, including bias means connected between said electrical reference and said electrical sensor and in series with said outputs of said amplifier stages.

3. An amplifier circuit for measuring low level signals in the presence of widely ranging common mode voltages, said amplifier comprising:

means for current measurement sensing;

first biasing means for reducing the common mode voltage; said first biasing means coupled to said means for current measurement sensing;

a plurality of Darlington amplifier stages serially connected to each other, each said Darlington amplifier stage serially connected to said means for current measurement sensing for receiving an even amount of voltage between said Darlington amplifier stage; at least one of said Darlington amplifier stages serially connected through said first biasing means;

an output circuit means coupled to at least one of said Darlington stages, said output circuit comprising:

an amplifier, for amplifying the signals comprising a first operational amplifier with an inverting input terminal, a noninverting input terminal, an output terminal, said inverting input terminal connected directly to said output terminal through one of said Darlington amplifier stage amplifier stages, and said noninverting input terminal serially connected to said means for current measurement sensing;

a voltage divider serially connected to said amplifier between said amplifier and one of said Darlington amplifier stages, said voltage divider for in effect reducing voltage; and a second biasing means for in effect reducing the common mode voltage of said output circuit means.

4. An amplifier as set forth in claim 2 wherein said output signal means comprises;

a resistor connected between the output of said second Darlington transistor amplifier stage and said electrical reference;

a second operational amplifier having its non-inverting input connected to the collector output of said second Darlington transistor amplifier stage; and a source of bias connected to said inverting input of said second operational amplifier corresponding to the potential across said resistor with said electrical signal at zero; wherein there appears across the output of said second operational amplifier a selected range of amplified signal voltage output proportional to the voltage range of said electrical signal.

5. An amplifier as set forth in claim 4 wherein said isolation amplifier is an operational amplifier having its non-inverting input connected to said first terminal and its said inverting input connected to its output.

6. An amplifier circuit as set forth in claim 3 wherein:
said Darlington amplifier stages have a plurality of inputs and outputs, at least one said output of at least one Darlington amplifier stage serially connected to at least one input of another said Darlington stage.

7. An amplifier circuit as set forth in claim 6, said amplifier of said output circuit means further comprising:
a second operational amplifier with an inverting input terminal, a noninverting input terminal, and an output terminal, said noninverting input terminal serially connected to said outputs of at least one Darlington, said inverting input connected to ground.

8. An amplifier circuit as set forth in claim 7 wherein:
said operational amplifiers further comprise a plurality of terminals for voltage biasing,
said first biasing means coupled to said voltage biasing terminals of said first operational amplifier;
said second biasing means coupled to said voltage biasing terminals of said second operational amplifier.

9. An amplifier circuit as set forth in claim 8 wherein:
said voltage divider is comprised of a plurality of resistors.

10. An amplifier circuit as set forth in claim 9 further comprising:
a buffer means between said current measurement sensing means and said first operational amplifier.

11. An amplifier circuit as set forth in claim 10, wherein said buffer means is a voltage follower circuit.

12. An amplifier circuit as set forth in claim 11 wherein:
said voltage follower circuit comprises a third operational amplifier with an inverting input terminal, a non-inverting input terminal, an output terminal and two terminals for voltage biasing, to said inverting input terminal connected directly to said output terminal, said non-inverting input terminal serially connected to said input lead between said power source and said first resistor.

13. An amplifier circuit as set forth in claim 12 wherein:
said plurality of Darlington amplifier stages is two, said first Darlington amplifier stage comprises first and second PNP transistors, each of said transistors having a collector, a base, and an emitter, said collectors being serially connected to each other, said emitter of said first transistor being connected to said inverting input of said first operational amplifier, said base of said first transistor serially connected to said emitter of said second transistor, said base of said second transistor serially connected to said output terminal of said first operational amplifier;
said second Darlington amplifier stage comprises first and second PNP transistors, each of said transistors having a collector, a base, and an emitter, said collectors being serially connected to each other, said emitter of said first transistor being serially connected to said collectors of said first Darlington amplifier stage, said base of said first transistor serially connected to said emitter of said second transistor, said base of said second transistor serially connected to non-inverting terminal of said first operational amplifier.

14. An amplifier circuit as set forth in claim 13, further comprising:
a resistor between said emitter of said first transistor and base of said first transistor of said first and second Darlington amplifier stages,
a resistor between said emitter of said second transistor and base of said second transistor of said first and second Darlington amplifier stages.

15. An amplifier circuit as set forth in claim 14 wherein said means for current meaurement sensing is a resistor.

* * * * *